(12) United States Patent
Uzoh et al.

(10) Patent No.: US 6,780,772 B2
(45) Date of Patent: Aug. 24, 2004

(54) METHOD AND SYSTEM TO PROVIDE ELECTROPLANARIZATION OF A WORKPIECE WITH A CONDUCTING MATERIAL LAYER

(75) Inventors: Cyprian E. Uzoh, San Jose, CA (US); Bulent M. Basol, Manhattan Beach, CA (US); Homayoun Talieh, San Jose, CA (US)

(73) Assignee: Nutool, Inc., Milpitas, CA (US)

( * ) Notice: Subject to any disclaimer, the term of this patent is extended or adjusted under 35 U.S.C. 154(b) by 0 days.

(21) Appl. No.: 10/032,219

(22) Filed: Dec. 21, 2001

(65) Prior Publication Data

US 2003/0139053 A1 Jul. 24, 2003

(51) Int. Cl.[7] .............................................. H01L 21/302
(52) U.S. Cl. ........................ 438/690; 438/691; 205/123
(58) Field of Search ................................. 438/689, 690, 438/691, 692; 205/123, 157, 220

(56) References Cited

U.S. PATENT DOCUMENTS 6,083,835 A * 7/2000 Shue et al. ................. 438/687
6,143,155 A * 11/2000 Adams et al. ................. 205/87
6,315,883 B1 * 11/2001 Mayer et al. ............... 205/123
6,582,579 B1 * 6/2003 Uzoh .......................... 205/115

* cited by examiner

Primary Examiner—Kin-Chan Chen
(74) Attorney, Agent, or Firm—Pillsbury Winthrop LLP

(57) ABSTRACT

Systems and methods to operate upon a nonplanar top surface of a conductive surface layer of a workpiece, so as to, for example, preserve the structural integrity of a dielectric film layer disposed below the conductive surface layer, are presented. According to an exemplary method, a layer of conducting material such as a conducting paste is applied over the nonplanar top surface of the conductive surface layer to obtain a planar top surface. At least a portion of the conducting material layer and at least a portion of the conductive surface layer are removed in a planar manner to at least partially planarize the nonplanar top surface. The conducting material layer may be annealed so that the conducting material layer diffuses with the conductive surface layer prior to removal of at least the portions of conducting material layer and the conductive surface layer.

16 Claims, 14 Drawing Sheets

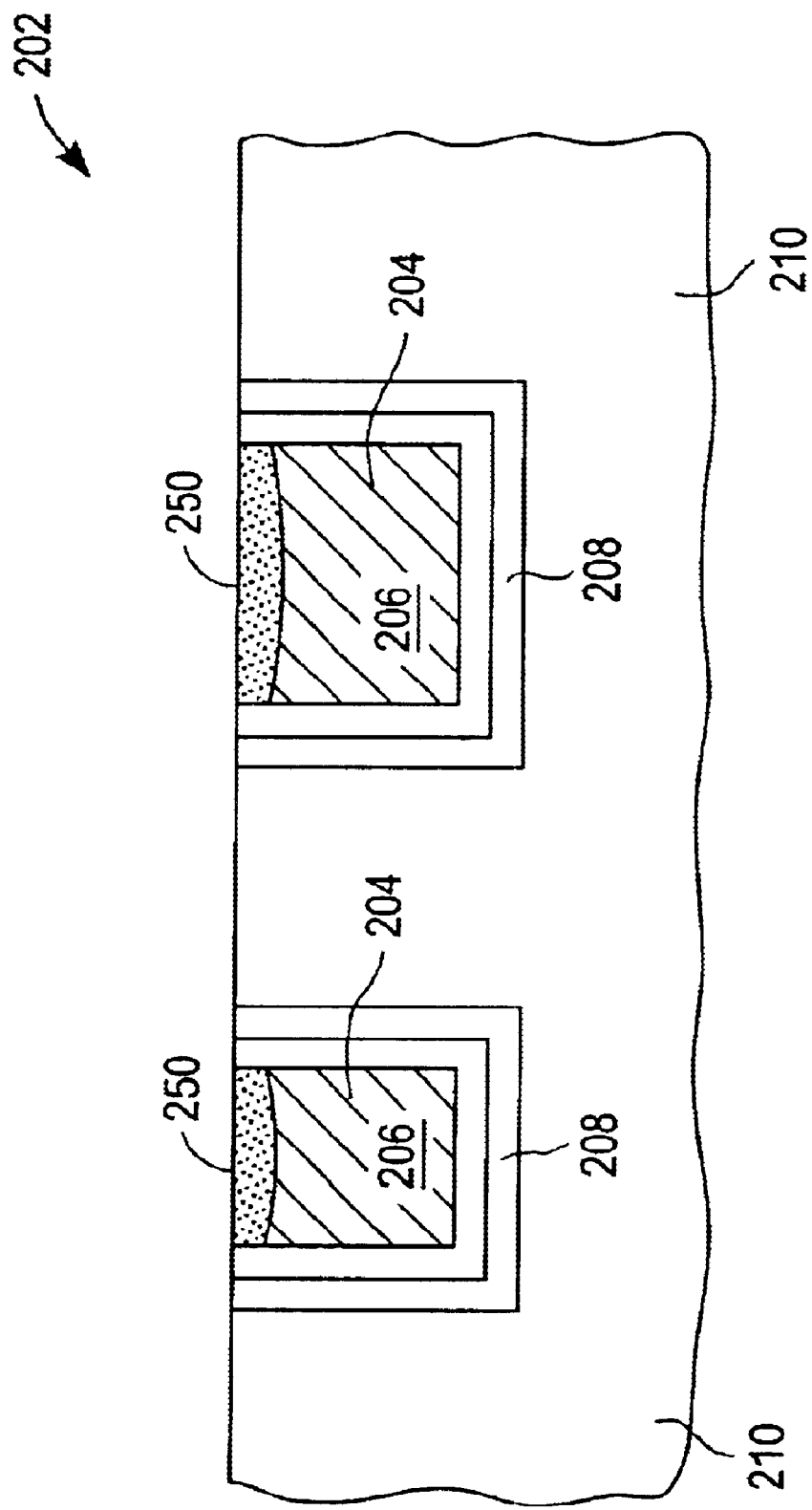

METHOD AND SYSTEM TO PROVIDE ELECTROPLANARIZATION OF A WORKPIECE WITH A CONDUCTING MATERIAL LAYER

BACKGROUND OF THE INVENTION

1. Field of the Invention

The present invention generally relates to semiconductor integrated circuit technology and, more particularly, to techniques for removing metal from the surface of a patterned workpiece having fragile layers, without disturbing the structural integrity of the fragile layers and the wiring structure.

2. Description of the Related Art

Removal of excess material in a uniform manner from the surface of coated patterned substrates has wide range of applications. One of these applications is in the field of integrated circuit manufacturing. Conventional semiconductor devices such as integrated circuits generally include a semiconductor substrate, usually a silicon substrate, and a plurality of sequentially formed dielectric interlayers such as silicon dioxide, and conductive paths or interconnects made of conductive materials. Copper and copper alloys have recently received considerable attention as interconnect materials because of their superior electromigration and low resistivity characteristics. The interconnects are usually formed by filling a conductor such as copper in features or cavities etched into the dielectric interlayers by a metallization process. In an integrated circuit, multiple levels of interconnect networks laterally extend with respect to the substrate surface. Interconnects formed in sequential layers can be electrically connected using features such as vias or contacts.

In a typical interconnect fabrication process, first an insulating interlayer is formed on the semiconductor substrate. Patterning and etching processes are performed to form features such as trenches, pads, and vias in the insulating layer. Then, a metal such as copper is deposited on the substrate through a metallization process to fill all the features. The preferred method of copper metallization process is electroplating.

FIG. 1 illustrates a cross-sectional view of a surface region of an exemplary substrate 102 such as a wafer with features 104 such as trenches and vias formed into the insulating, or dielectric, layer 110 of the substrate 102. In conventional deposition processes, a barrier layer 108, and then, in the case of copper deposition, a very thin copper, or copper alloy, seed layer 112 are coated onto the insulating layer 110 and into the features 104. As shown in FIG. 2, a material 106, typically a metal such as copper (Cu), is deposited on the wafer 102 surface. Typically, the goal of a planarization process is to remove the metal 106 from the top surface of the wafer 102, leaving the metal 106 only in the features 104. This is presently achieved by a polishing technique such as chemical mechanical polishing (CMP), electropolishing, etching, or a combination of these techniques. The polishing techniques are conducted to remove the excess material 106 layer or material overburden and other conductive layers 112, 108 that are above the top surface of the insulating layer 110 of substrate 102.

With a patterned substrate 102 that has features 104, the metal 106 when deposited onto the substrate 102 will tend to align to the features 104, leaving valleys 114 in a top surface 116 of the metal 106 layer. In most commonly used CMP approaches, the surface of the substrate 102 is contacted with a pad and the pad is moved with respect to the surface. Companies such as 3M, Rodel, and Universal Photonics supply CMP pads of various types to the industry. The role of the pad is to polish the surface of the substrate 102 and to remove the material 106 on the surface with the help of, for example, a chemical solution or a slurry containing abrasive particles. When CMP techniques are used to remove a portion of the metal layer, the dielectric layer 110 of the substrate 102 receives uneven pressure from a polishing tool, such as the polishing pad, due to the valleys 114 in the metal 106 layer. Also, the resulting force from the CMP polishing pressures can easily exceed the fracture strength of the dielectric, or of any of the metal-dielectric interfaces. For this reason, fragile insulators and many low dielectric constant ($\kappa$) films used as the dielectric layer 110 are easily damaged during CMP operations on metals 106 such as copper.

FIG. 3A shows the cross-section of the same substrate 102 after, for example, a CMP technique has been applied and the excess metal 106 and the barrier layer 108 outside the features 104 have been removed. The substrate 102 is planarized so that the metal layer 106 is only in the features 104, but the dielectric layer 110 of the substrate 102 has been damaged. As illustrated in FIG. 3A, defects such as cracks 118 are present in the dielectric layer 110. As another example of defects, FIG. 3B shows the cross-section of the same substrate 102 after, for example, an electropolishing technique has been applied and a thin layer of excess metal 106a outside the features 104 is left behind. The topographic features, valleys 114, in the metal 106 layer have been effectively transferred into the features 104, leading to defects. The electropolished substrate 102 exhibits discontinuities between the metal 106a outside of the features 104 and the metal 106 within the features 104. Defects and damage to the fragile dielectrics in workpieces, for example, semiconductor wafers, as in FIG. 3A, and defects such as surface discontinuities due to uneven polishing, as in FIG. 3B, can render the workpieces unusable for their intended purpose.

Avoiding damage to fragile dielectric films on workpiece and substrates presents a challenge for state of the art CMP techniques. The higher the polishing pressure, the higher the metal removal rates are during CMP operations. Higher polishing pressures of, for example, three to six pounds per square inch (psi), while practical for strong dielectric films such as silicon dioxide, silicon nitride, and alumina, are problematic for many films with low dielectric constants, such as SOX, SILK, diamond like carbon (DLC), and their likes, let alone porous dielectrics. This is because they tend to be more fragile than silicon dioxide. In general, CMP operations that occur at low pressures, for example, less than three psi, do minimize the damage to the fragile dielectrics, but the operations result in lower metal removal rates, hence lower process throughput and higher operating costs.

It is also known to us an electrochemical mechanical deposition (ECMD) process, or a combination ECMD and electrochemical mechanical etching (ECMD/ECME) process to obtain a planar conductive surface over what had previously been a non-planar conductive layer, as described, for example, in U.S. Pat. No. 6,176,992. While usage of an ECMD process or an ECMD/ECME process is advantageous, having other processes that can also provide planarization are desirable.

To this end, it would be desirable to have other methods and systems for providing material removal and planarization of the surface of a substrate such as a semiconductor wafer surface that preserves the structural integrity of the dielectric layer, particularly in the case of fragile dielectric film layers.

SUMMARY OF THE INVENTION

By way of introduction only, the presently preferred embodiments described herein include systems and methods for providing material removal and planarization of the surface of a workpiece such as, for example, a semiconductor device or wafer, while preserving and improving the structural integrity of the dielectric layer on the workpiece and the entire wiring structure.

Systems and methods to operate upon a nonplanar top surface of a conductive surface layer of a workpiece, so as to, for example, preserve the structural integrity of a dielectric film layer disposed below the conductive surface layer, are presented. According to one aspect of the present invention, a layer of conducting material such as a conducting paste, an emulsion of a conducting material, or a slurry of a conducting material is applied over the nonplanar top surface of the conductive surface layer to obtain a planar top surface. At least a portion of the conducting material layer and at least a portion of the conductive surface layer are removed in a planar manner to at least partially planarize the nonplanar top surface. The conducting material layer may be, for example, heat treated to burn off binding agents or organic dispersants when these are used, to interfuse interparticle spacing, or to momentarily melt the metallic particulates or flakes and to enhance the interdiffusion of the conducting material layer with the conductive surface layer prior to removal of at least the portions of conducting material layer and the conductive surface layer.

In another aspect of the present invention, a highly conducting material layer may be applied to a workpiece to planarize the workpiece and/or to repair any of a variety of defects in the workpiece topographical structure. The conducting material layer might also be applied to alloy the material deposited in the trenches and vias or to selectively alloy the top surface of the wiring structure, to enhance properties such as electromigration lifetime, corrosion resistance, adhesion or surface reflectivity, for example. The conducting material may be applied using a spin-on process as described above, or another application process may be used as suitable.

The foregoing discussion of aspects of the invention has been provided only by way of introduction. Nothing in this section should be taken as a limitation on the following claims, which define the scope of the invention.

BRIEF DESCRIPTION OF THE DRAWINGS

The foregoing and other features, aspects, and advantages will become more apparent from the following detailed description when read in conjunction with the following drawings, wherein:

FIG. 9B is a diagram illustrating a cross-sectional view of the exemplary substrate of FIG. 9A following removal of the barrier layer outside of the features of the substrate.

DETAILED DESCRIPTION OF THE PREFERRED EMBODIMENT

The present invention will now be described in detail with reference to the accompanying drawings, which are provided as illustrative examples of preferred embodiments of the present invention.

Methods and systems for removing material from the surface of a patterned workpiece having a fragile dielectric film layer while preserving the structural integrity of the dielectric layer are presented according to presently preferred embodiment of the present invention.

Figure 4:
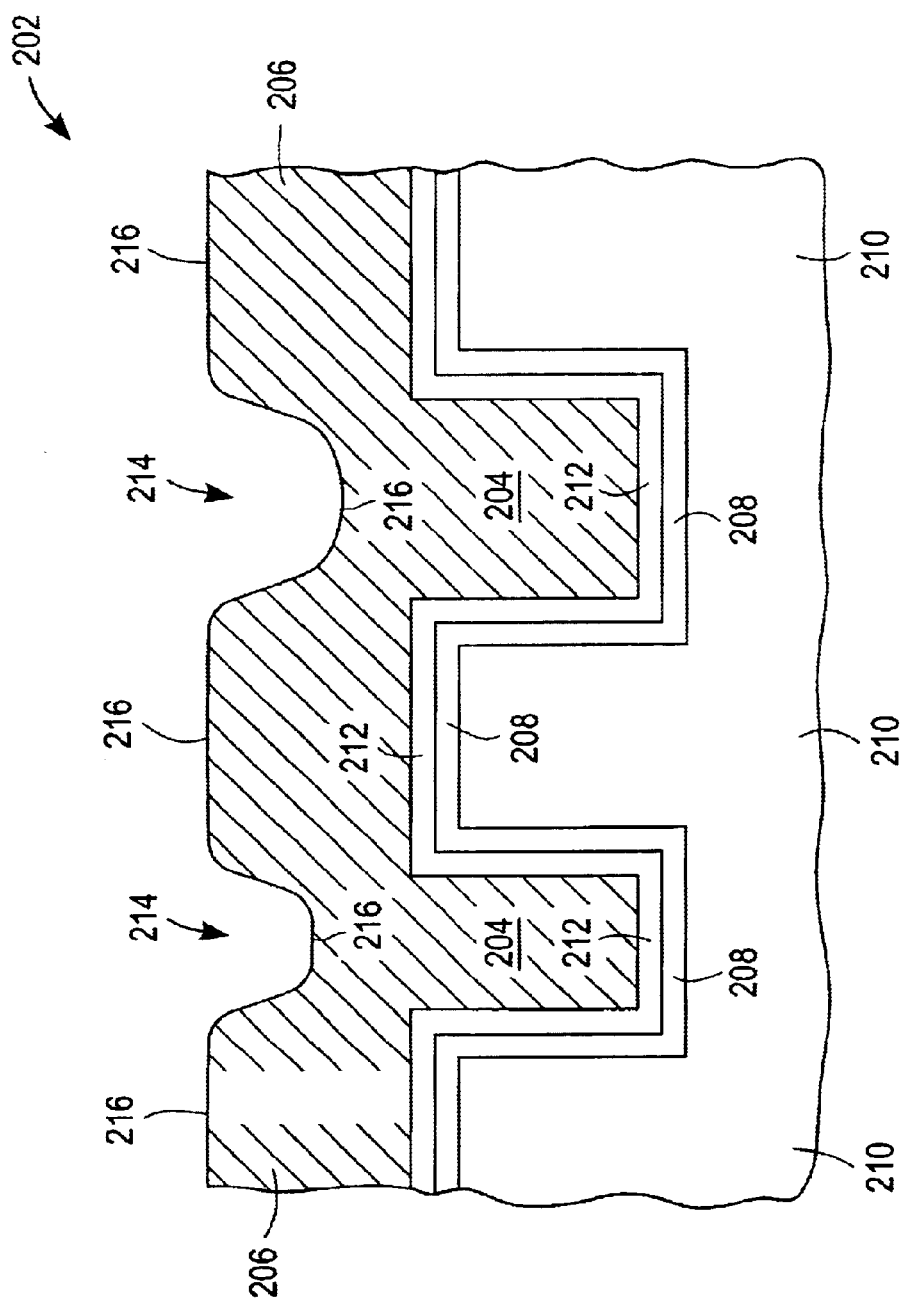
FIG. 4 is a diagram illustrating a cross-sectional view of an exemplary substrate with metal overburden deposited on a top surface of the substrate.

Referring first to FIG. 4, it is a diagram illustrating a cross-sectional view of an exemplary substrate 202 such as a wafer with features 204 such as trenches and vias formed into a dielectric layer 210 of the substrate 202. The workpiece or substrate 202 may be, for example, a silicon wafer plated with a conductor metal material 206, preferably copper or copper alloys. In conventional metal layer 206 deposition processes, a barrier layer 208, and then, in the case of copper deposition, a very thin copper, or copper alloy, seed layer 212 to initiate copper growth, are coated onto the insulating layer 210 and into the features 204 of the insulating layer 210 of the substrate 202. The barrier layer 208 can be made up of bilayers such as, for example, a chromium nitride (CrN)/tantalum (Ta) bilayer, a Ta/tantalum nitride (TaN) bilayer or a titanium (Ti)/titanium nitride (TiN) bilayer. Also, multi-layer barrier systems such as, for example, TaN/Ta/TaN/Ta, Ta/TaN/Ta, Cr/TaN/Ta, or Cr/CrN/Ta, may be used.

The conductor metal layer 206 may be, for example, copper (Cu), aluminum, gold, nickel, platinum, silver, tin, lead, bismuth, antimony, or the respective alloys of these metals. The conductor metal layer 206 is deposited on the substrate 202 surface topography over and into the features 204. The metal layer 206 that does not fall within the features 204 is considered metal layer 206 overburden. It is desirable that the metal layer 206 overburden be removed from the top surface of the substrate 202, leaving the metal only in the features 204. Depending on the application, it is often preferable that other conductive layers such as the seed layer 212 and the barrier layer 208 that are above the top surface of the insulating layer 210 of substrate 202 be removed as well.

With a patterned substrate 202 that has features 204, the metal layer 206 when deposited onto the substrate 202 will tend to align to the features 204, leaving cavities such as valleys or trenches 214 in a top surface 216 of the metal layer 206. As described above, when conventional CMP techniques are used to remove a portion of the metal layer 206, the dielectric layer 210 of the substrate 202 receives uneven pressure from a polishing tool, such as a polishing pad and its admixture of slurry or slurries, due to the trenches 214 in the metal layer 206. Also, the resulting local polishing force may exceed the fracture strength of the dielectric material or of the various metal-dielectric interfaces within the wiring structures. For this reason, fragile insulators and many low dielectric constant ($\kappa$) films used as the dielectric layer 210 are easily damaged during conventional CMP operations on metals such as copper or others listed above.

Figure 5A:
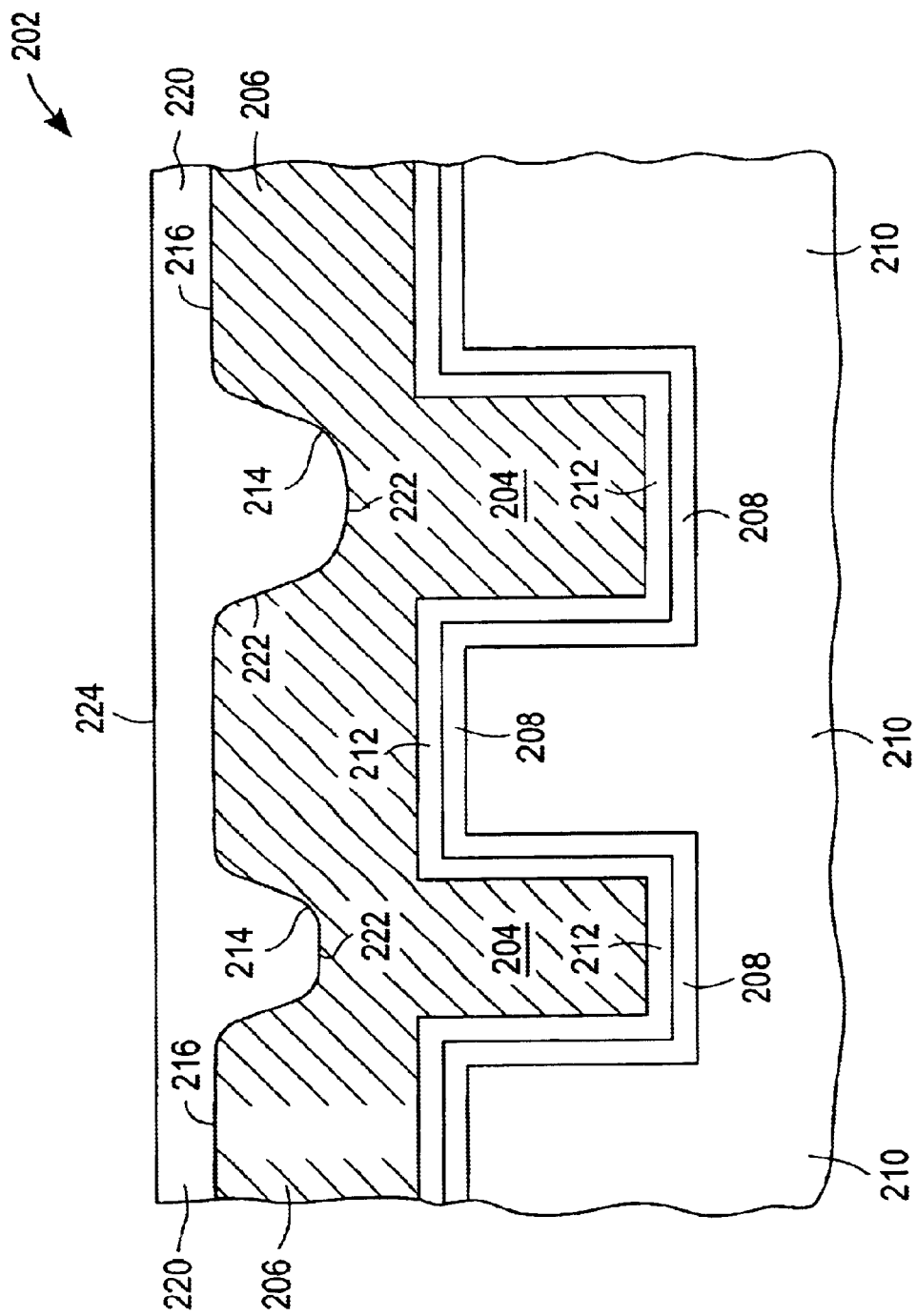
FIG. 5A is a diagram illustrating a cross-sectional view of the exemplary substrate of FIG. 4 with a layer of highly conducting material according to a presently preferred embodiment of the present invention applied over the metal overburden.
Figure 5B:
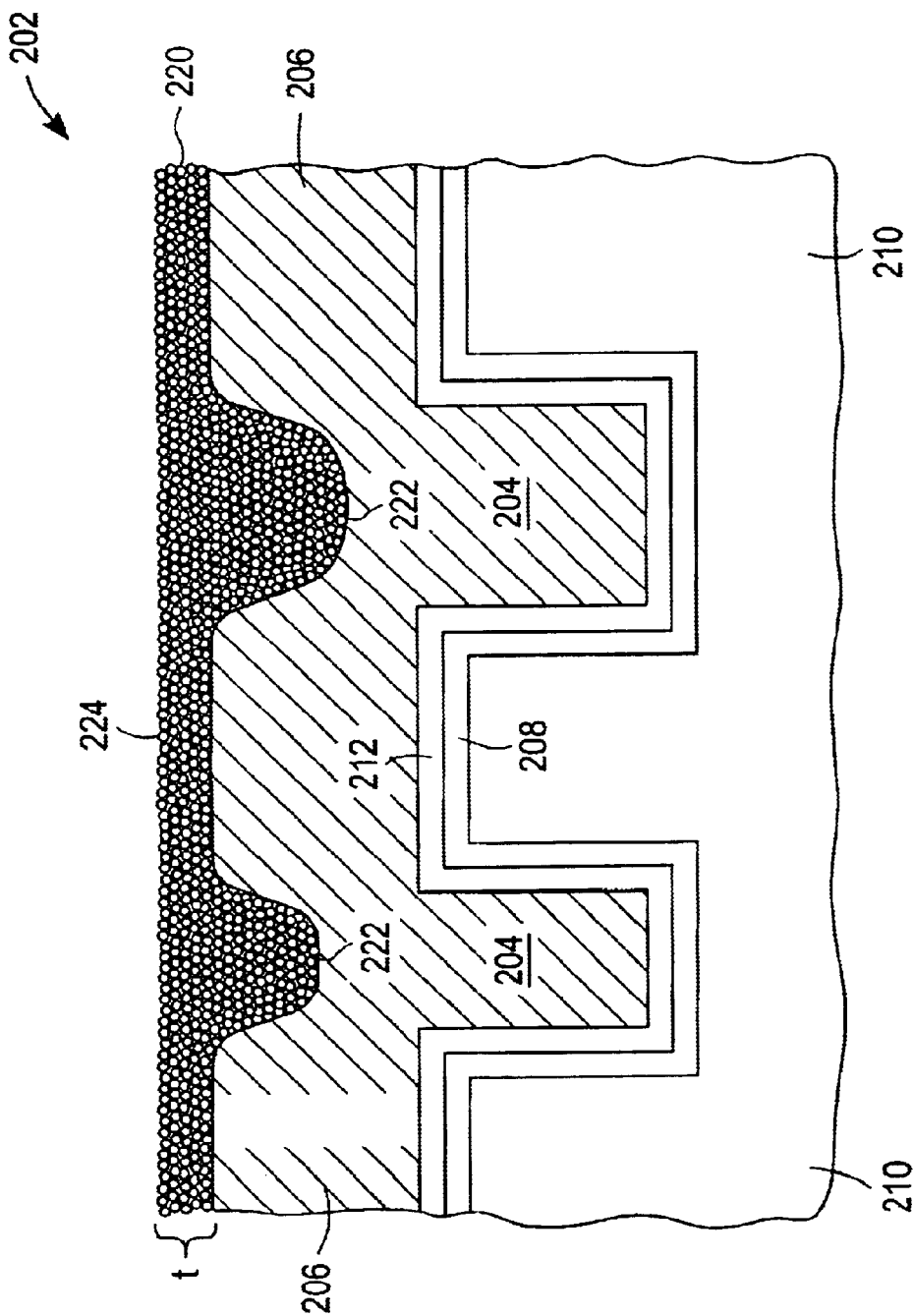
FIG. 5B is a diagram illustrating a cross-sectional view of the exemplary substrate of FIG. 4 with a layer of highly conducting material that includes metallic powder according to a presently preferred embodiment of the present invention applied over the metal overburden.

FIG. 5A is a diagram illustrating a cross-sectional view of the exemplary substrate 202 of FIG. 4 with a layer of a highly conducting material layer 220 according to a presently preferred embodiment of the present invention formed over the metal layer 206. The highly conducting material that forms conducting material layer 220 can be, for example, a paste, a liquid or slurry or emulsion, a low melting point metallic powder as illustrated in FIG. 5B, or flakes or platelets 220. The conducting material layer 220 is preferably applied to the top surface 216 of the metal layer 206 so that a lower boundary 222 of the conducting material layer 220 contacts the top surface 216 of the metal layer 206. The conducting material is applied in such a way that the top surface of conducting material layer 220, and thus the topography (which can also be viewed as a planarized multi-layer structure that includes metal layer 206 and conducting material layer 220) is planarized. It should be understood that for aspects of this invention that do not require planarizing the metal layer 206, such as obtaining a particular diffusion profile within features 204 of metal layer 206, that the conducting material layer 220 may be applied using techniques that do not result in a planar top surface of the conducting material layer 220. The conducting material layer 220 has a minimal thickness t that is preferably kept very small, and, in some embodiments, may be zero. The conducting material layer 220 fills in the topographic features or depressions 214 in the top surface 216 of the metal layer 206. In a presently preferred embodiment, the conducting material used in conducting material layer 220 is, for example, paste, liquid, slurry, or powder that, regardless of its nature, is applied using a conventional spin-on process, spraying, doctor blading or other planar depositing technique.

Figure 5C:
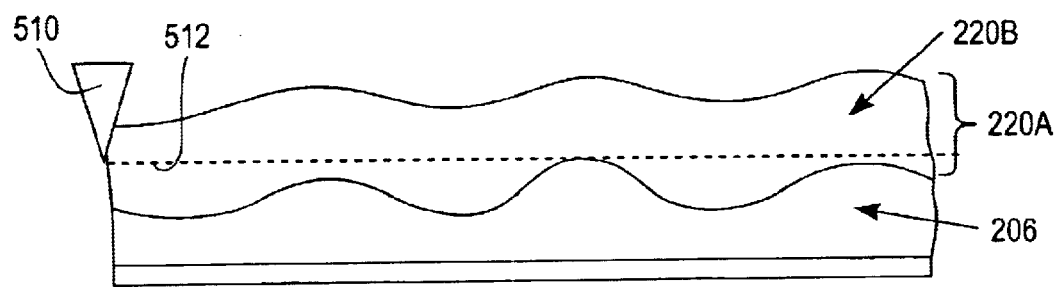
FIG. 5C illustrates a doctor blading technique for applying a planar conductive material.

Using a doctor blading technique, for example, as shown in FIG. 5C, a nonplanar conducting material layer 220A of the conductive material is applied over the metal layer 206, and a doctor blade 510 is moved across the surface along line 512 to remove the excess portion 220B that is above the line 512, thereby leaving a planarized conducting material layer 220.

In some applications, multiple coatings of the conductive material used to form conductive material layer 220 may be preferable. For example, the conducting material layer 220 may include more than one layer. The first layer may include flakes or platelets of a low melting metallic powder, while the next layer may be a slurry having spherical metal powders to cover the platelets or vice versa. In other embodiments, the first layer may be, for example, materials of one alloy composition, and the next layer may be composed of a dissimilar alloy. The boundary between the various layers within the conducting material layer 220 may be contiguous, depending on the method of and the intent behind application of the conducting material. Of course, the application of the highly conducting material or materials to form conductive material layer 220 may be accomplished by many methods, including physical vapor deposition (PVD), for example.

The conducting material can be, for example, a paste or a slurry containing copper or copper alloys, powders, flakes or platelets. Besides copper alloy, other low-temperature melting alloys, pastes, or liquids may be used. These may include, but are not limited to, conducting materials having melting points between 10 to 400 degrees (deg) C. Good examples of these materials are the various binary, tertiary and quaternary alloys of Cu, tin (Sn), bismuth (Bi), indium (In), silver (Ag), lead (Pb), zinc (Zn), and antimony (Sb). Examples of binary alloys are 48 to 58 percent Sn/52–42 percent In, and 97 percent In/3 percent Ag, having melting points between 117 to 146 deg. C. These binary alloys are obtainable from Indium Corporation of America. A binary alloy 42 percent Sn/58 percent Bi paste is available from ESP Solders. Ternary low melting point alloys may include 16.5 percent Sn/32.5 percent Bi/51 percent In, having a melting point of 60 deg. C., 77 percent Sn/20 percent In/3 percent Ag with a melting point of 175 to 187 deg. C., and 95.75 percent Sn/3.5 percent Ag/0.75 percent Cu having a melting point of 216 to 220 deg. C. An example of a quaternary alloy is 95.8 percent Sn/3.5 percent Ag/0.7 percent Cu/0.3 percent Sb, with a melting point in the range of 216 to 223 deg. C., available from Almit.

Besides alloy powders and pastes, powders or flakes of suitable metals can be blended to form a conductive paste or emulsion or a slurry. The conductive paste or emulsion may contain nanometer ($10^{-9}$ m) sized metal particles. The metal particle size may range between 3 nm to over 1000 nm or higher. Regardless of the particular sizes of the metal particles, it is preferable that the distribution of the metal particle sizes form an electrically conducting layer when heat treated and that interparticle voids are absent or minimized. For example, in the case of a conducting material containing mixtures of copper and indium powders, the powders may be emulsified with suitable organic binders such as stearic acid and butanol or emulsifiers such as those used in conventional powder metallurgy operations. Also, besides heat, similar emulsifiers may be used to lower the viscosity of a viscous paste, preferably prior to coating the substrate 202 or semiconductor wafer of interest.

No matter which conducting material is used to form the conducting material layer 220, when used in conjunction with an electropolishing process, which could be a conventional electroetching process or an electrochemical mechanical etching process, the conducting material in the conducting material layer 220 that is applied should electropolish at substantially the same rate as the metal layer 206 will electropolish. Typically, this requires that both layers have substantially the same conductivity characteristics.

The organic agent(s) that is/are used in preparing the pastes/emulsions are preferably removed at low temperatures by controlled heating of the substrate 202 at a rate of about 0.5 to 1 deg. C./sec in an inert, reducing or vacuum environment.

The substrate 202 is heated, so that the inorganic binder, having the lowest melting point constituent for powder mixtures, melts very briefly to wet and fill up the interparticle voids and has just sufficient time to interdiffuse into the substrate 202 before solidification. For example, in the case of copper, a suitable low melting point metal or metal alloy, based on inspection of the phase diagram of copper, may be chosen for the binder. The binder could also be metals that form low temperature eutectics. A small amount of indium, tin, bismuth, antimony powder or low melting point alloys, powders, or eutectics, may be used as a binder for the copper powders.

Figure 6A:
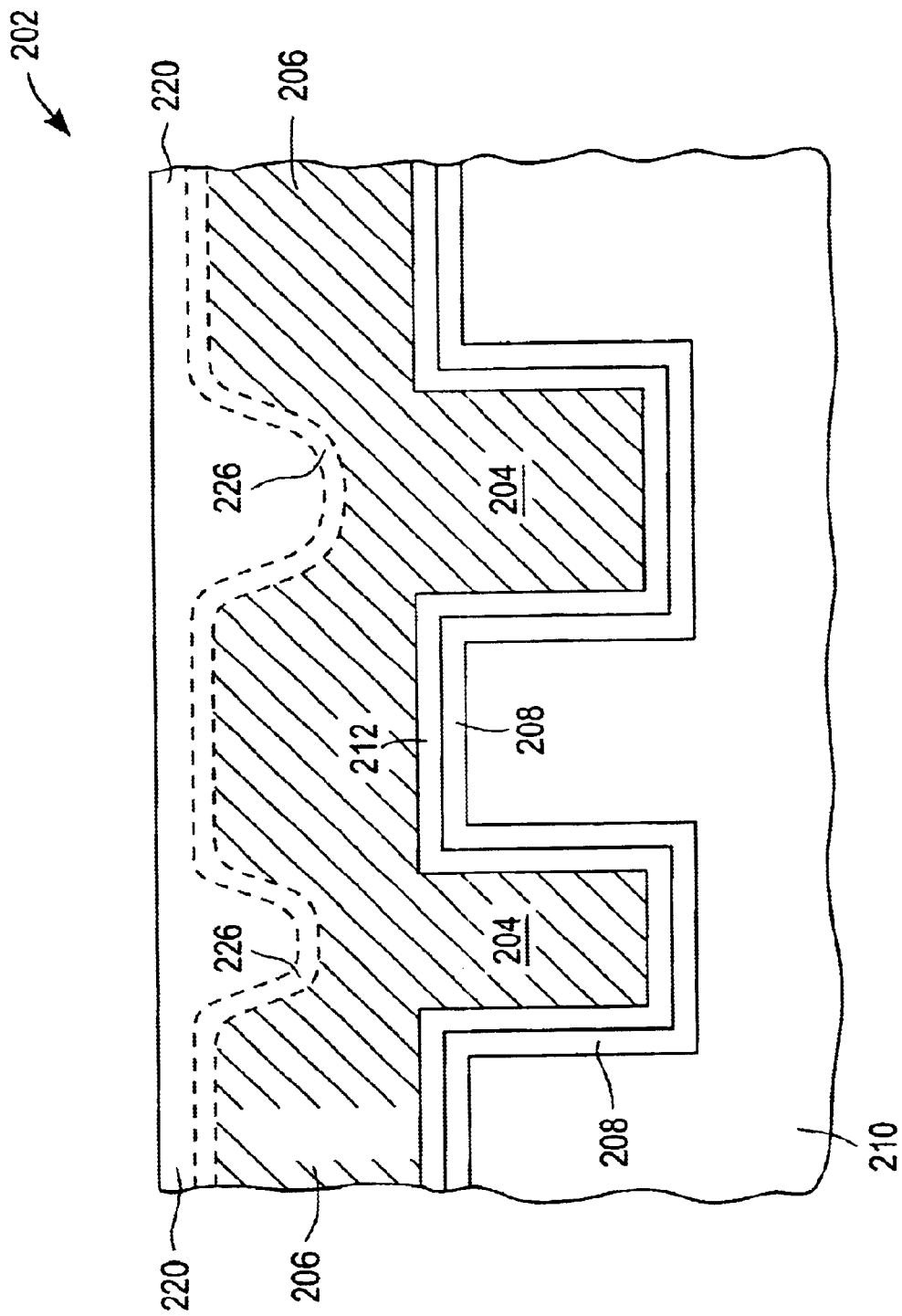
FIG. 6A is a diagram illustrating a cross-sectional view of the exemplary substrate of FIG. 5A with diffusion occurring between the layer of highly conducting material and the metal overburden.

FIG. 6A is a diagram illustrating a cross-sectional view of the exemplary substrate 202 of FIG. 5A with diffusion occurring between the layer of highly conducting material 220 and the metal layer 206. Following the application and planarization of the highly conducting material layer 220, the planarized surface of the material layer 220 is preferably annealed to enhance the inter-diffusion of the layer 220 and the metal layer 206, for example, copper 206, layer at the lower boundary of the layer 220. A diffusion area or region 226 develops between the conducting material layer 220 and the metal layer 206 as the layer 220 and the metal layer 206 intersperse with one another, so that the boundary between the layer 220 and the deposited metal layer 206 becomes diffuse.

The annealing temperature may range between 100 to 400 degrees C., preferably in an inert, or reducing or even vacuum ambient. The heat treatment times may vary between 10 seconds to 200 minutes. In general, the higher the temperature, the shorter the heat treatment times. For example, the annealing treatment may be by a rapid thermal anneal (RTA) or laser anneal process. For some conducting materials 220, it is preferable that an inert gas source, such as helium or nitrogen or their combinations, be used to heat the substrate 202 quickly to the desired temperature for a brief period. Then helium or the like would be used to rapidly quench, or extract heat from, the heated sample. Of course, it will be apparent to one skilled in the art that other heating methods, such as infrared, microwave, laser lamp, scanning laser source, or conventional hot plates or ovens, may be used as suitable.

Figure 6B:
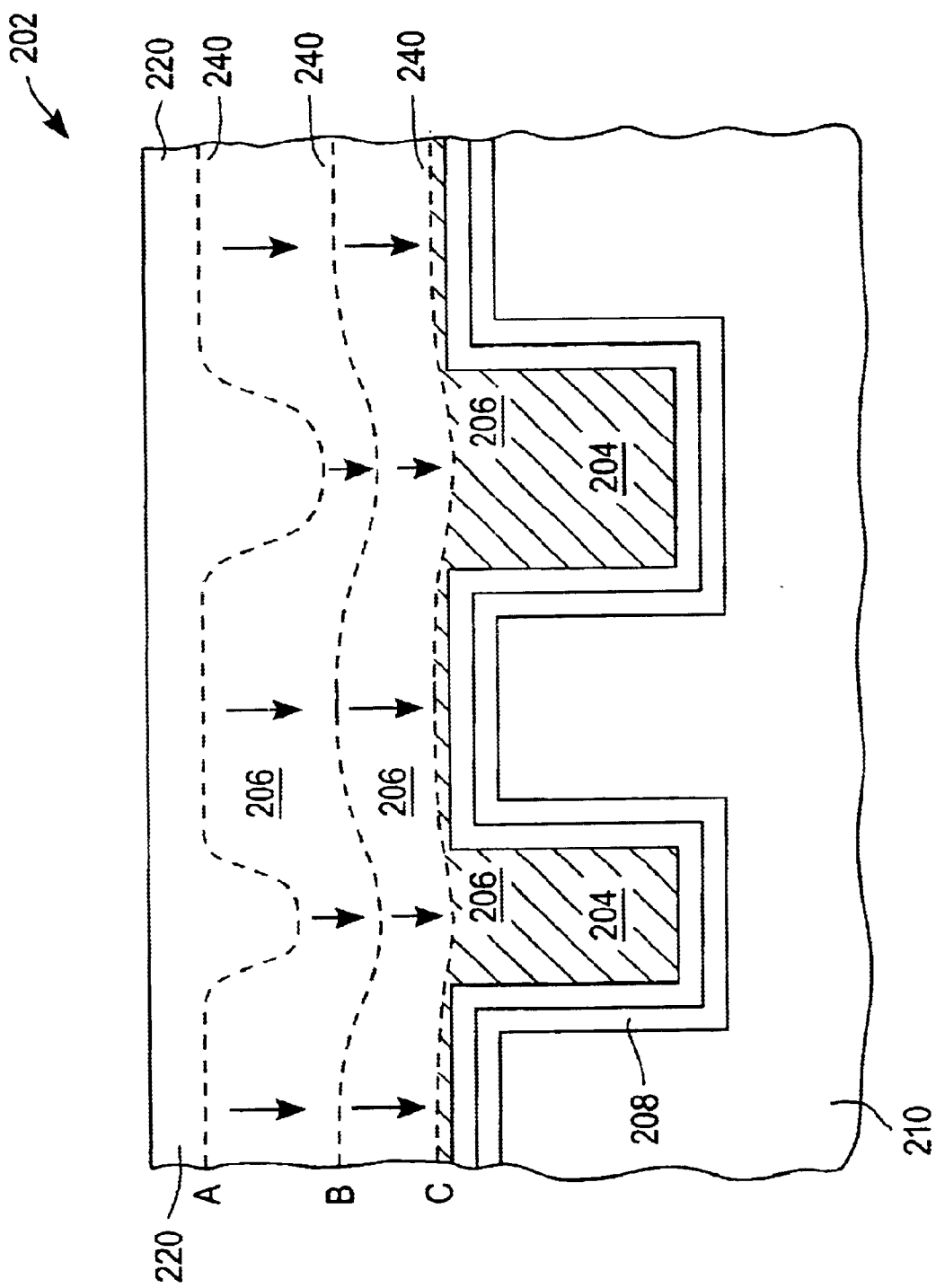
FIG. 6B is a diagram illustrating a cross-sectional view of the exemplary substrate of FIG. 5A showing movement of diffusion front from the layer of highly conducting material into the metal overburden.

In another embodiment of this invention, it is desired to introduce one or more constituents from conducting material layer 220 into the features 204 containing the portions of metal layer 206. For example, the layer 220 may be rich in indium, tin, antimony, or bismuth compared to the metal overburden or the metal layer 206 in the features 204. By heat treating, such as annealing, the substrate 202 after the conducting material layer 220 has been coated onto the substrate 202, indium, tin, antimony, or bismuth, for example, diffuse from a region of higher concentration that is the conducting material layer 220, toward a region with a lower concentration, such as the metal layer 206 in the features 204 as shown in FIG. 6B. Upon anneal, desirable solutes such as indium, tin, antimony or bismuth migrate from an initial coating boundary A of layer 220, where they have higher initial concentration, towards the metal layer 206 where their concentration is lower. The arrows depict the direction of migration of the desirable solutes. A diffusion front 240 moves from point A to an intermediate range B and then to a distal range C as shown in FIG. 6B. From range B, the diffusion front 240 which is initially established at an interface, or boundary A, of the layers 206, 220, progresses into the metal layer 206. At range C, the diffusion front 240 reaches the barrier layer 208 covering top of the insulator layer. The choice of annealing temperature and ambient may be based on the solubility of the desired solute of layer 220 into the metal layer 206 and its equilibrium and non-equilibrium phase diagram.

Figure 1:
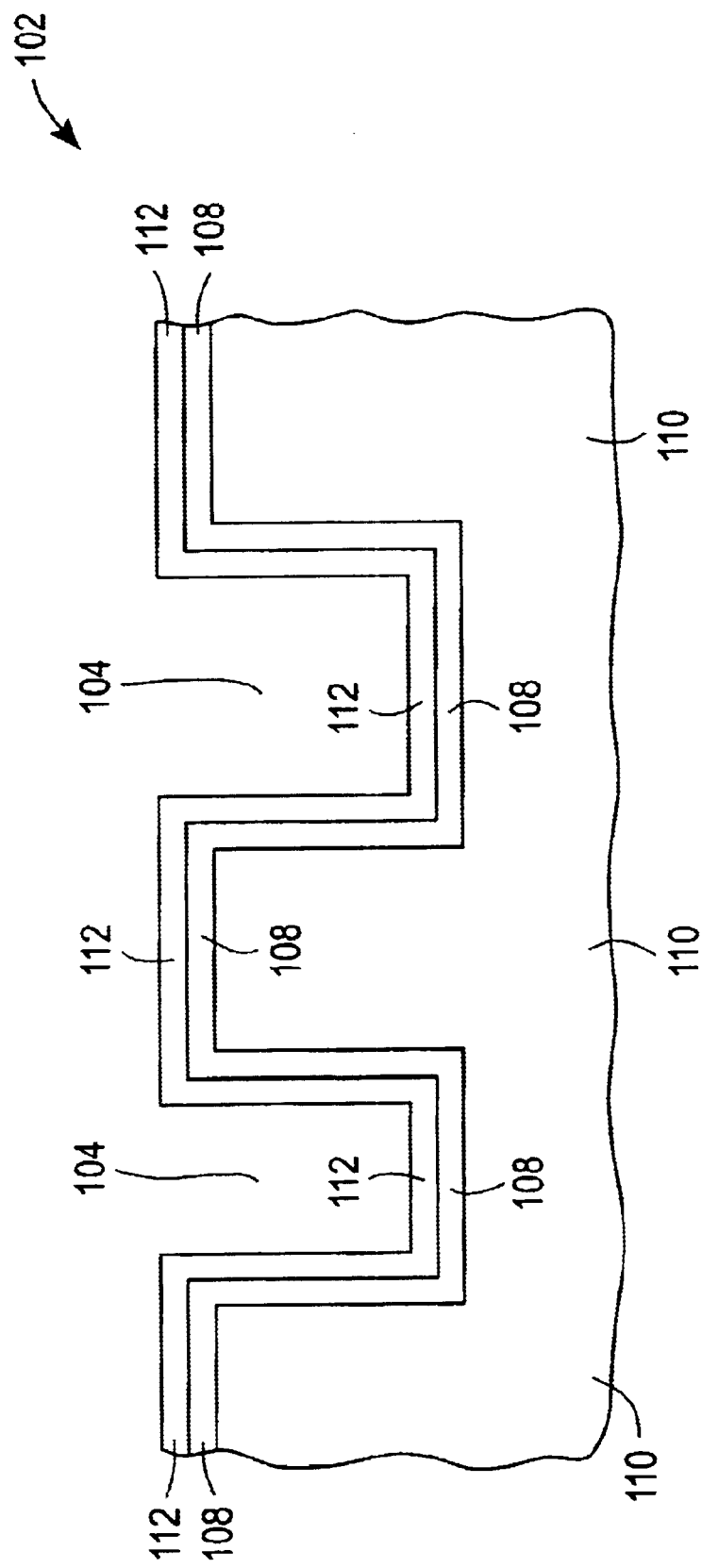
FIG. 1 is a diagram illustrating a cross-sectional view of an exemplary substrate prior to deposition of material onto the surface of the substrate.
Figure 2:
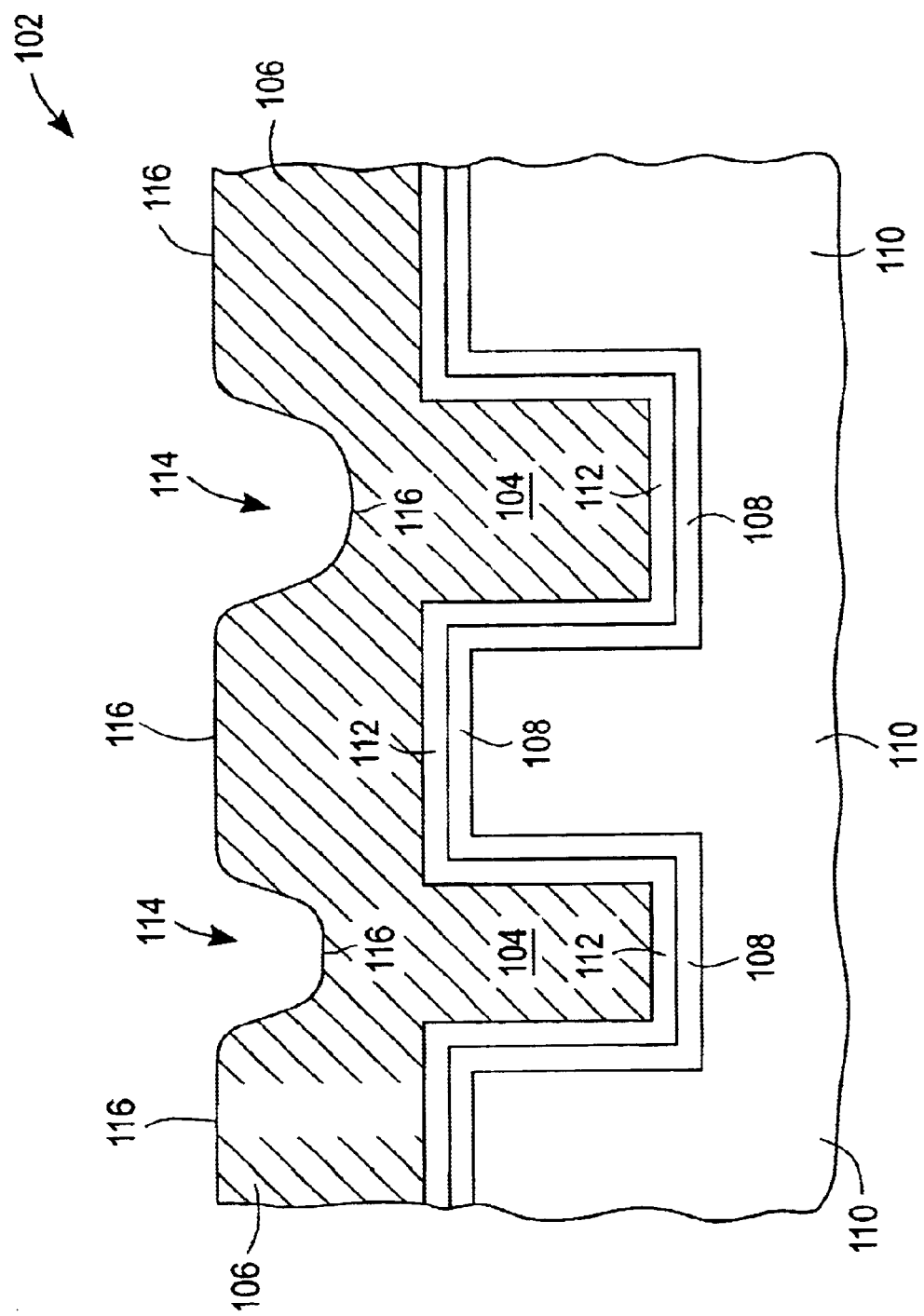
FIG. 2 is a diagram illustrating a cross sectional view of an exemplary substrate with metal overburden deposited on the surface of the substrate.
Figure 3A:
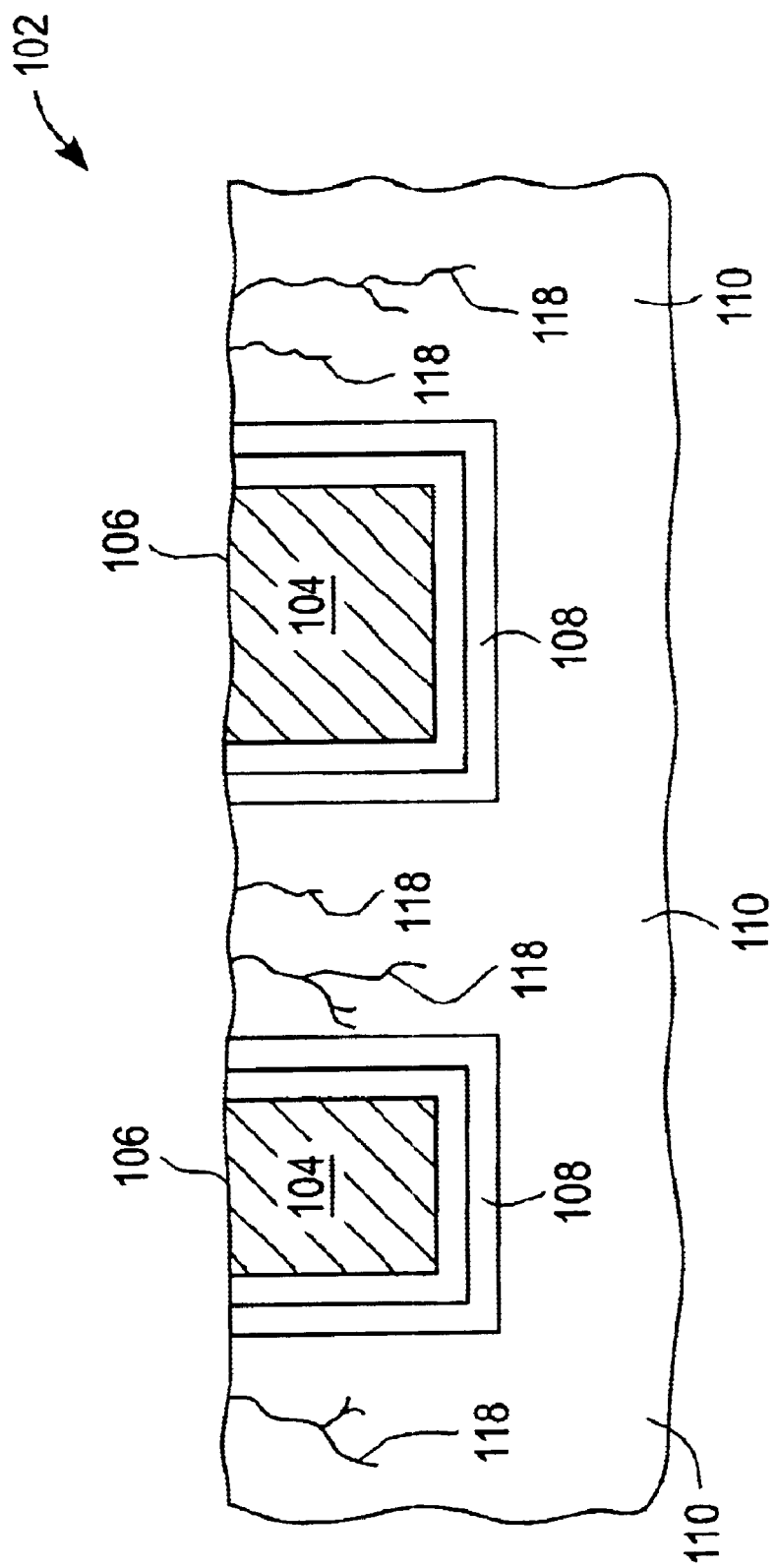
FIG. 3A is a diagram illustrating a cross-sectional view of an exemplary substrate following removal of the metal overburden from the surface of the substrate.
Figure 3B:
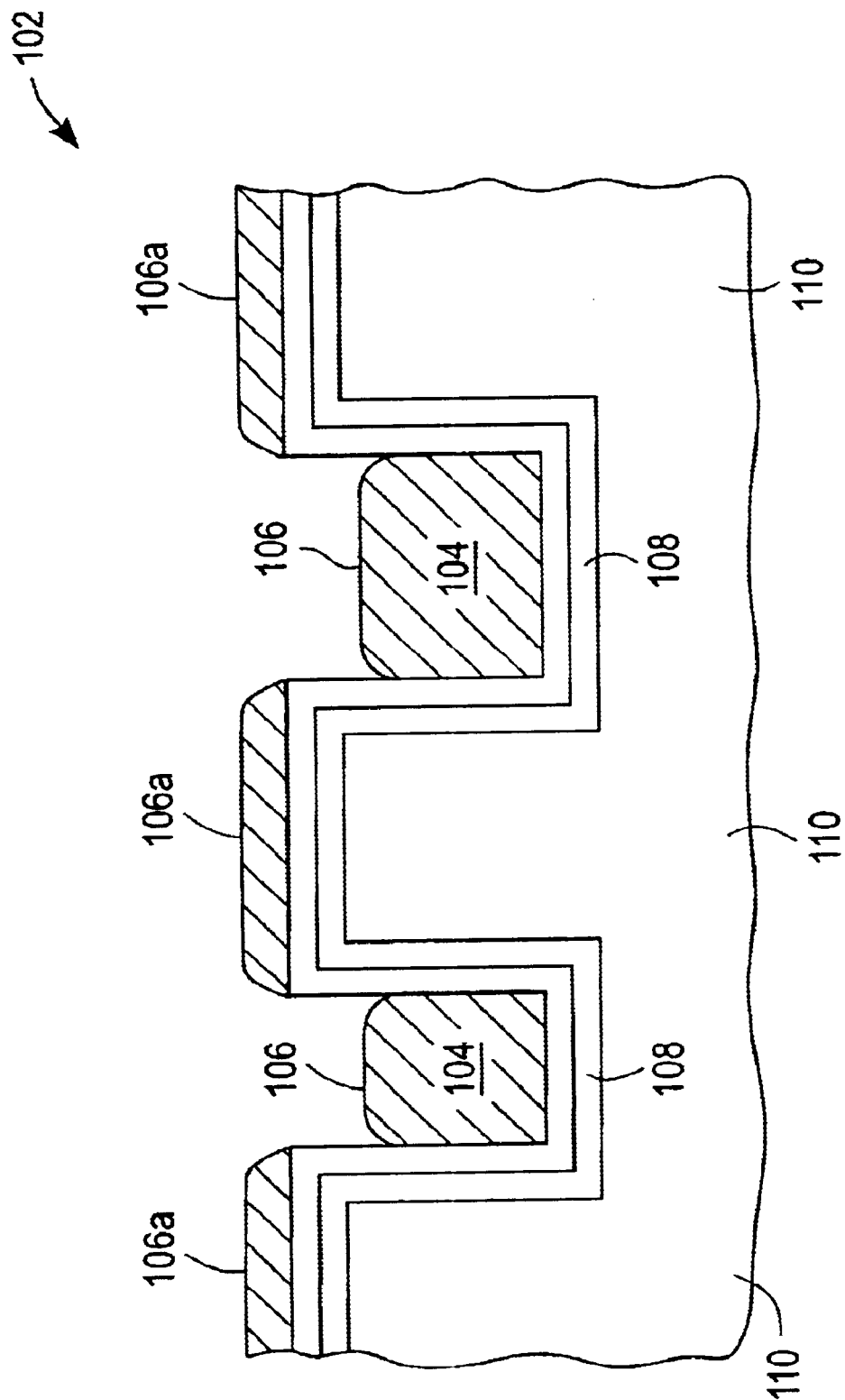
FIG. 3B is a diagram illustrating a cross-sectional view of an exemplary substrate following polishing of the metal overburden at the surface of the substrate.
Figure 7:
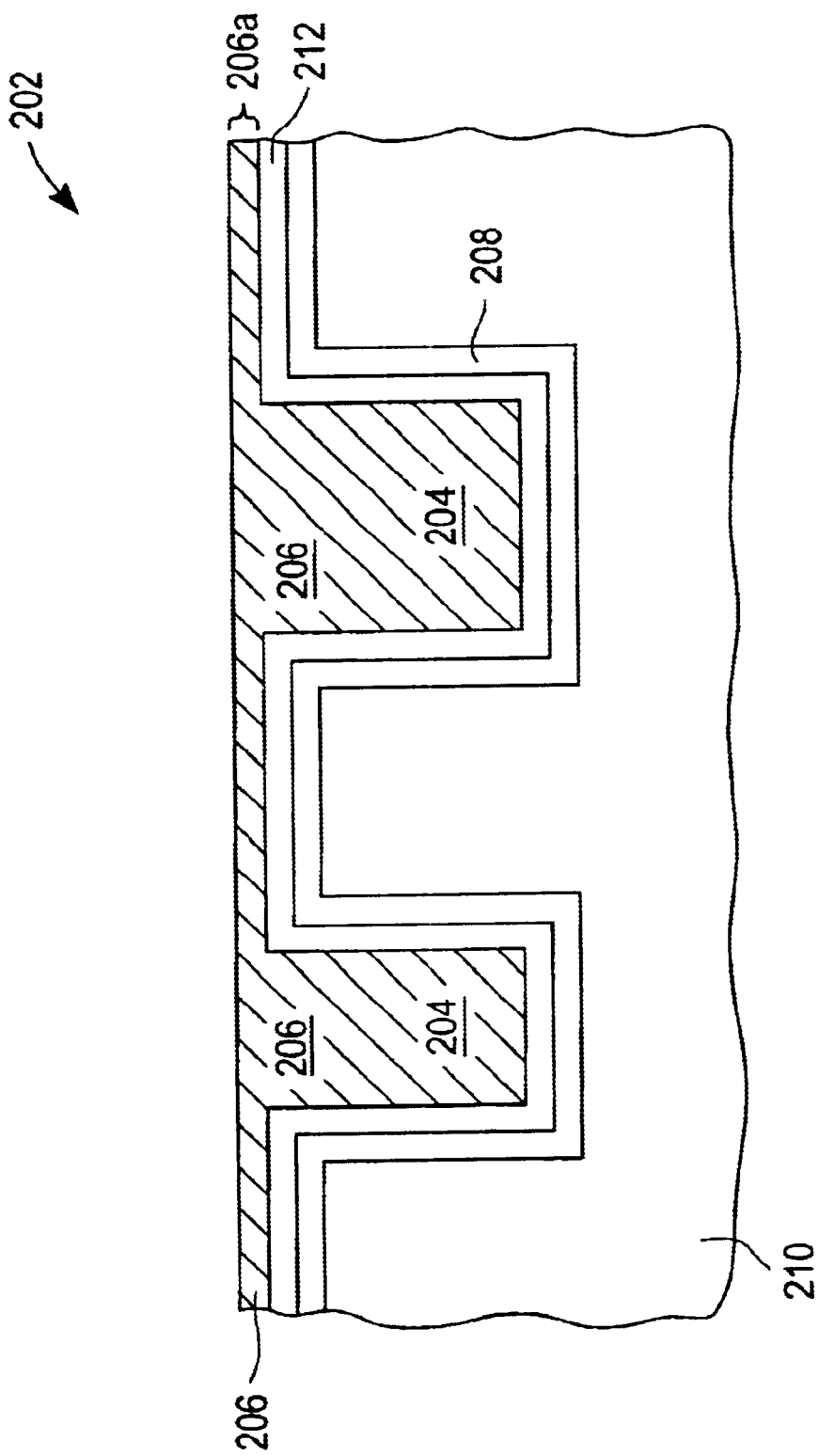
FIG. 7 is a diagram illustrating a cross-sectional view of the exemplary substrate of FIG. 6 following removal of the layer of highly conducting material and a portion of the metal overburden.

FIG. 7 is a diagram illustrating a cross-sectional view of the exemplary substrate 202 of FIG. 6A following removal of the layer 220 of highly conducting material 220 and a portion of the overburden. Once the layer 220 has been applied and planarized, as shown in FIG. 5A, and diffusion has preferably occurred between the layer 220 and the metal layer 206, as shown in FIG. 6B, the substrate 202 is electropolished or electroetched down close to the seed layer 212 and the barrier layer 208. Preferably, in the case of copper, a suitable electropolishing chemical such as phosphoric acid, or a phosphoric acid-chromic mixtures is used. In FIG. 7, a thin metal layer 206a is left behind once the layer 220. The remaining thin metal layer 206a is then removed by a planar removal process such as low force CMP. The substrate 202 of FIG. 7, which is polished, with features 204 can be contrasted with the electropolished substrate 102 shown in FIG. 3B. FIG. 3B depicts the result of the conventional electropolishing of the substrate 102 of FIG. 2 with topographic features 114 without conductive layer planarization according to an aspect of the present invention. The electropolished substrate 102 of FIG. 3B shows discontinuity between the metal layer 106a and the metal 106 in the features 104, rendering the substrate 102 unusable for its intended purpose.

In contrast to a conventional CMP process to remove the metal layer 206, the electropolishing of the workpiece 202 evenly removes the conducting material layer 220 and the portion of the metal layer 206 so that the workpiece is planarized evenly irrespective of the features 204, while preventing damage to the dielectric film layer 210.

The thin metal layer 206a film left behind following electropolishing or electroetching, as shown in FIG. 7, may be removed using, for example, a very gentle CMP process. Of course, in other applications, it may be most preferable to remove the thin metal layer 206a using a wet etch method as suitable.

Figure 8:
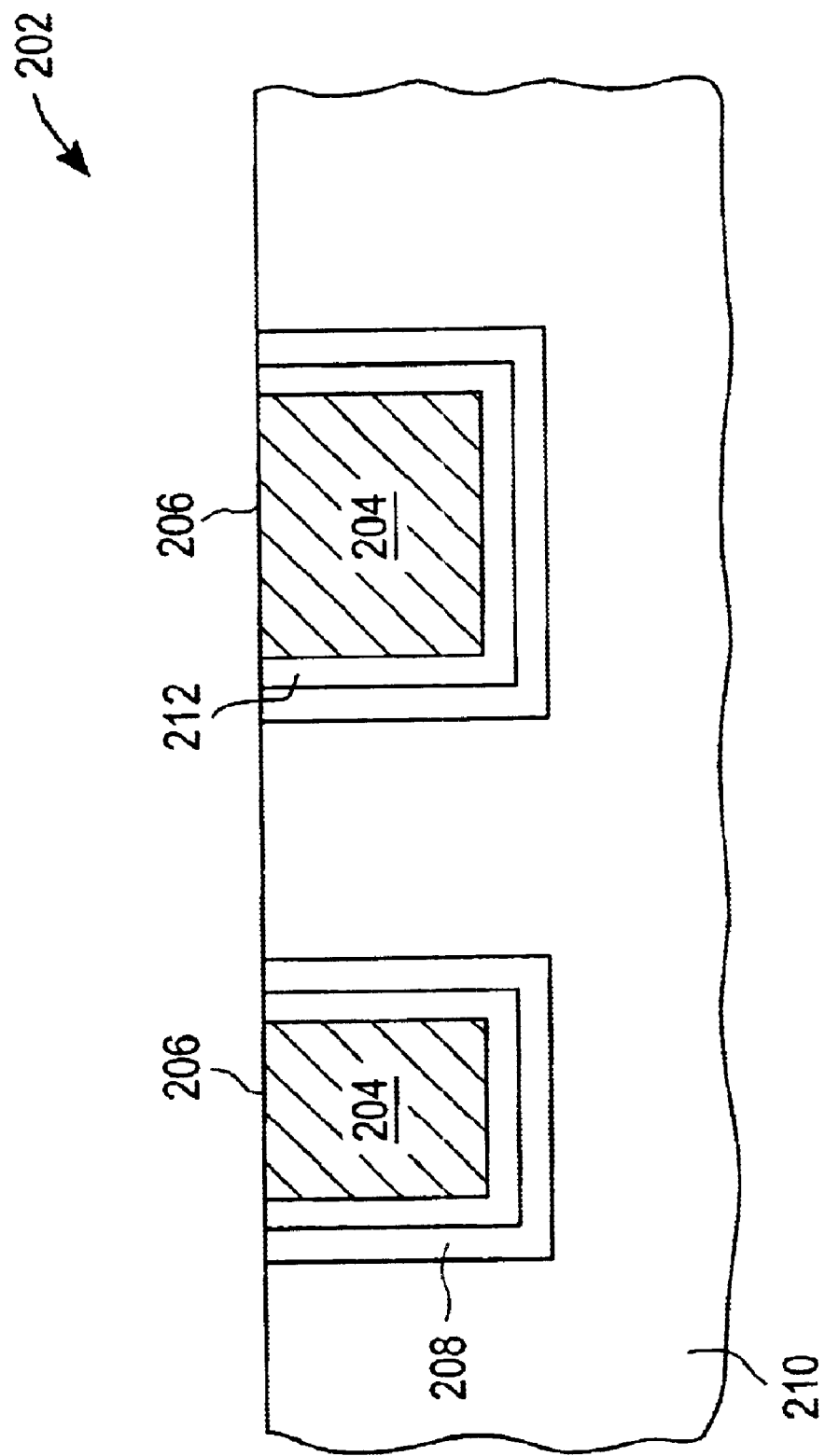
FIG. 8 is a diagram illustrating a cross-sectional view of the exemplary substrate of FIG. 7 following removal of the metal overburden and the barrier layer outside of the features of the substrate.

In other embodiments of this invention, it may be desirable to electropolish the metal layer 206 down to the barrier layer 208. A portion of the barrier layer 208 may then be removed, as shown in FIG. 8, by, for example, a very brief reactive ion etching (RIE) process stopping on the insulator layer 210. Barrier layers 208 such as TaN, Ta, tungsten (W) and their various compounds can be removed with a suitable fluoride plasma, such as $CF_4$ plasma. The barrier layer 208 may also be removed by, for example, using an abrasive slurry, electropolishing, or wet etching.

FIG. 8 is a diagram illustrating a cross-sectional view of the exemplary substrate shown in FIG. 7 following removal of the metal layer 206 which is outside the features of the substrate 202 and the barrier layer 208. As shown in FIG. 8, the metal layer 206 is removed from the top of the dielectric layer 210 so that remains of the metal layer 206 lies within the features 204 of the substrate 202. Portions of the barrier and seed layers 208, 212 may also be removed, as can be seen in FIG. 8, so that substantially all that remains of these layers 208, 212 surrounds the features 204. The dielectric film layer 210 of FIG. 8, in contrast to the dielectric film layer 110 of FIG. 3, is substantially free of defects such as cracks following removal of the conducting material layer 220, virtually the entire metal layer 206 overburden, and, optionally, portions of the seed and barrier layers 212, 208.

Figure 9A:
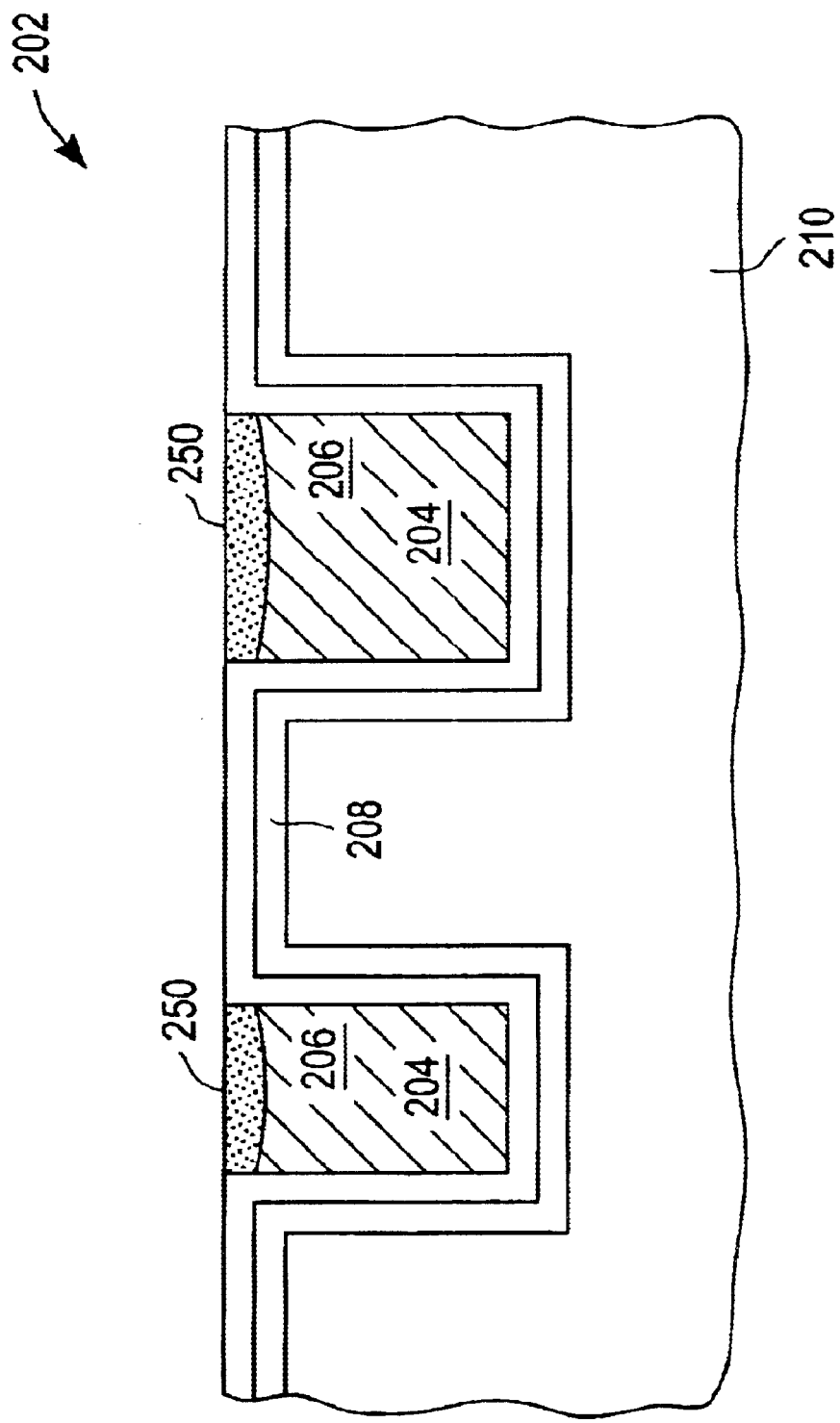
FIG. 9A is a diagram illustrating a cross-sectional view of the exemplary substrate of FIG. 6B following removal of the metal overburden outside of the features of the substrate.

Returning to the diffusion of desirable solutes such as indium, tin, antimony or bismuth from the conducting material layer 220 into the metal layer 206 in the features 204 in the dielectric 210, the electropolishing of the doped substrate 202 shown in FIG. 6B, results in the structure illustrated in FIG. 9A. As shown in FIG. 9A, after the material removal step, the top surfaces of the metal layer 206 within the features 204, including trenches, vias or other structure of interest, are capped with a solute-rich zone layer or region 250. The solute in the region 250 modifies the metallurgical properties of the top surface of the metal layer 206 within the features 204. Since the alloying increases the mechanical strength of the zone 250, compared to the metal layer 206 beneath, the alloying over the metal layer 206 in the features 204 reduces the surface mobility of, for example, copper atoms, thus improving electromigration lifetimes and, depending on composition, improving corrosion resistance. During, for example, reactive ion etching removal of the barrier layer 208 outside of the features 204, components of the reactive ion gas or plasma react with the solute rich region 250 over the structure to further stabilize the region 250. FIG. 9B shows the substrate 202 after a portion of the barrier layer 208 is removed. The highly conductive stabilized zone 250 now acts as a cap layer over the metal layer 206 beneath, protecting the metal layer 206 beneath from harmful environments. The stabilized zone 250, depending on composition, may react with elements in the air, such as oxygen and nitrogen, to form one or more monolayers of protective film that encapsulate the metal layer 206 into the features 204.

It should be understood that in other applications, conducting material such as a conducting paste might be applied to a workpiece to planarize the workpiece and/or repair any of a variety of defects in the workpiece topographical structure. The conducting material might also be applied to alloy the metal deposited in the trenches and vias or to selectively alloy the top surface of the wiring structure, to enhance properties such as electromigration lifetime, corrosion resistance, adhesion or surface reflectivity, for example. The conducting material may be applied using a spin-on process as described above, or another application process may be used as suitable.

It should be understood that the methods and systems described herein according to the present invention may be applied to polish a wide variety of workpieces and to remove many different materials, including barrier materials, from a wide variety of workpieces.

Although the present invention has been particularly described with reference to the preferred embodiments, it should be readily apparent to those of ordinary skill in the art that changes and modifications in the form and details may be made without departing from the spirit and scope of the invention. It is intended that the appended claims include such changes and modifications.

What is claimed is:

1. A method of planarizing a non-planar conductive surface layer on the workpiece, comprising:

applying a metallic conducting material layer having substantially a same conductivity characteristic as the non-planar conductive surface layer onto a top surface of the conductive surface layer of the workpiece using one of a spin-on, spray, doctor blading or other application technique that does not involve electroplating so that a top surface of the conducting material layer is planar, thus forming a planarized multi-layer structure that includes the non-planar conductive surface layer and the metallic conducting material layer; and electropolishing the planarized multi-layer structure to remove in a planar manner at least portions of the non-planar conductive layer and other portions of the metallic conducting material layer, wherein the electropolishing in the planar manner is assisted by using conducting material in the metallic conducting material layer that electropolishes at substantially the same rate as the non-planar conductive surface layer.

2. The method according to claim 1, further comprising the step of annealing the metallic conducting material layer so that at least one solute within the metallic conducting material layer diffuse with the conductive surface layer.

3. The method according to claim 2, further comprising the step of continuing to anneal the metallic conducting material layer so that the diffusion of the solute progresses into features of the conductive surface layer.

4. The method according to claim 1 further comprising the step of removing any remaining portion of the planarized multi-layer, thereby exposing a barrier layer.

5. The method according to claim 4, wherein the step of removing uses a chemical mechanical polishing process.

6. The method according to claim 4, wherein the step of removing uses one of a wet etching process.

7. The method according to claim 1 further comprising the step of removing any remaining portion of the planarized multi-layer and a barrier layer, thereby exposing the dielectric layer.

8. The method according to claim 7, wherein the step of removing uses a chemical mechanical polishing process.

9. The method according to claim 7, wherein the step of removing uses one of a wet etching process and a reactive ion etching process.

10. The method according to claim 1 wherein the metallic conducting material layer comprises at least one of a conducting paste, a conducting slurry and a conducting emulsion.

11. The method according to claim 1 wherein the metallic conducting material layer comprises a conducting slurry.

12. The method according to claim 1 wherein the metallic conducting material layer comprises a conducting emulsion.

13. The method according to claim 1 wherein the metallic conducting material layer comprises a conducting low melting point metallic powder.

14. The method according to claim 1 wherein the metallic conducting material layer comprises a first layer of a conducting low melting point metallic powder and a second layer of a slurry.

15. The method according to claim 1 wherein the step of electropolishing uses an electrochemical mechanical etching process.

16. The method according to claim 1 wherein the step of electropolishing uses an electrochemical etching process.

* * * * *